(12) United States Patent
Kwon et al.

(10) Patent No.: US 8,811,082 B2
(45) Date of Patent: Aug. 19, 2014

(54) SEMICONDUCTOR MEMORY DEVICE

(75) Inventors: Tae Heui Kwon, Seoul (KR); You Sung Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 140 days.

(21) Appl. No.: 13/492,132

(22) Filed: Jun. 8, 2012

(65) Prior Publication Data

US 2012/0314514 A1   Dec. 13, 2012

(30) Foreign Application Priority Data

Jun. 9, 2011   (KR) ........................ 10-2011-0055532

(51) Int. Cl.
*G11C 16/04*   (2006.01)
*G11C 16/08*   (2006.01)

(52) U.S. Cl.
CPC ....................................... *G11C 16/08* (2013.01)
USPC ............ 365/185.11; 365/185.17; 365/230.03; 365/130; 365/51; 365/231

(58) Field of Classification Search
CPC ............ H01L 29/7926; H01L 29/7827; H01L 27/11578; H01L 27/11551; G11C 16/0483; G11C 16/0466; G11C 8/14

USPC ............. 365/185.25, 189.09, 185.05, 185.17, 365/185.29, 185.33, 215, 51
See application file for complete search history.

(56) References Cited

U.S. PATENT DOCUMENTS

2011/0317489 A1 * 12/2011 Kim et al. ................ 365/185.18

FOREIGN PATENT DOCUMENTS

| KR | 1020100042454 | 4/2010 |
| KR | 1020110010045 | 1/2011 |

OTHER PUBLICATIONS

Preliminary Rejection issued by the Korean Intellectual Property Office on Nov. 27, 2012.

* cited by examiner

*Primary Examiner* — Thong Q Le
(74) *Attorney, Agent, or Firm* — IP & T Group LLP (57) ABSTRACT

A semiconductor memory device includes word lines stacked over a substrate having a plurality of memory block regions, select lines arranged over the word lines, vertical channel layers formed to penetrate through the select lines and the word lines and extending to the substrate, and a charge trap layer disposed between the word lines and the vertical channel layers, wherein the stacked word lines are separated by memory block groups that each include two or more memory block regions.

13 Claims, 12 Drawing Sheets

SEMICONDUCTOR MEMORY DEVICE

CROSS-REFERENCE TO RELATED APPLICATION

Priority to Korean patent application number 10-2011-0055532 filed on Jun. 9, 2011, the entire disclosure of which is incorporated by reference herein, is claimed.

BACKGROUND

An embodiment of this disclosure relates to a semiconductor memory device and, more particularly, to a semiconductor memory device including stacked word lines.

In semiconductor memory devices, as the size of a memory cell is gradually decreased to increase the integration degree, the manufacturing process becomes more difficult. To address such features, a three-dimensional (3-D) semiconductor memory device having a Pipe-shaped Bit Cost Scalable (hereinafter referred to as a P-BiCS) structure formed by stacking memory cells has been developed. The 3-D semiconductor memory device having a P-BiCS structure is described in detail below.

Figure 1:
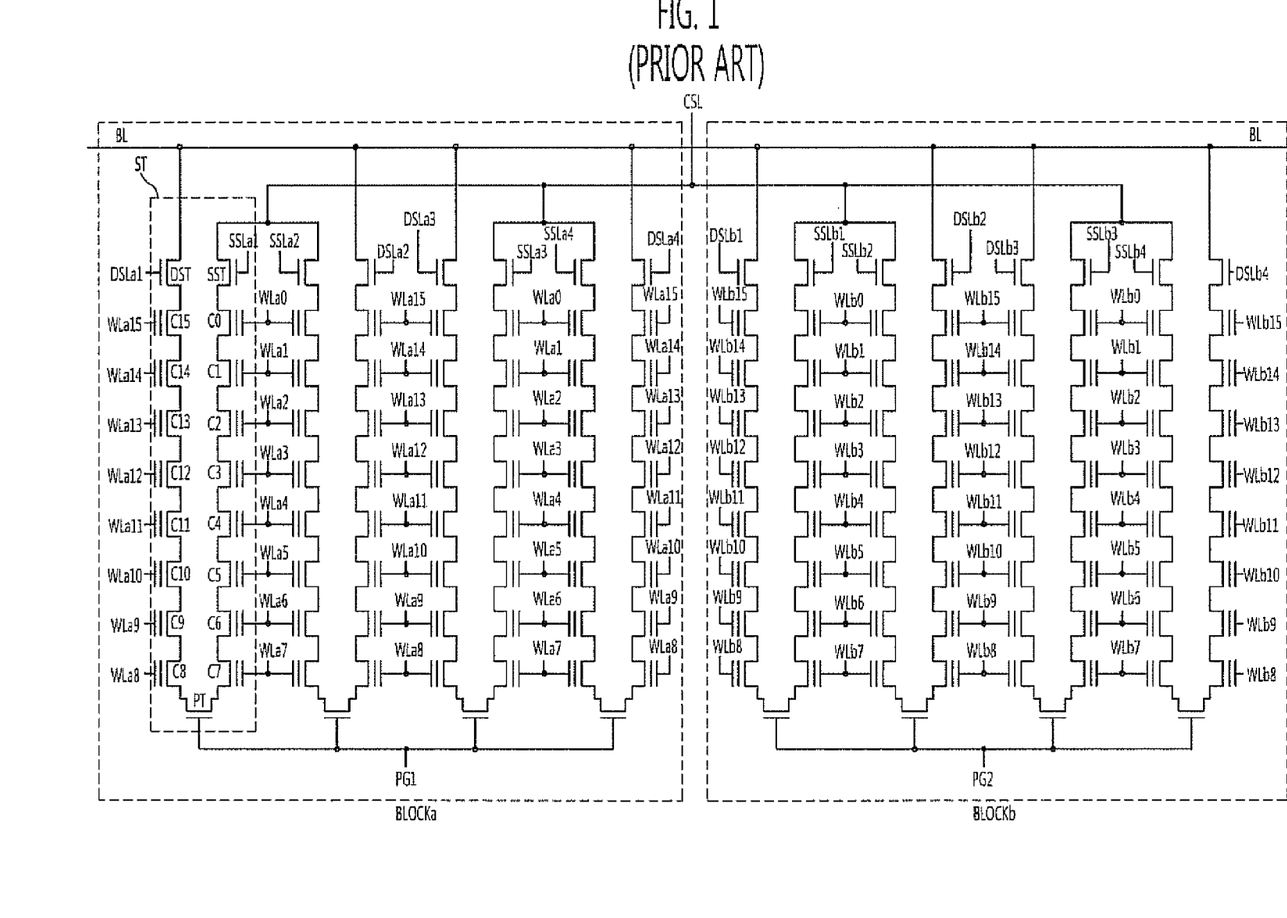
FIG. 1 is a circuit diagram illustrating a conventional memory block.

FIG. 1 is a circuit diagram illustrating a memory array included in a conventional semiconductor memory device having a P-BiCS structure.

Referring to FIG. 1, each of memory blocks BLOCKa and BLOCKb includes a plurality of memory strings ST. In the P-BiCS structure, each of the memory strings ST includes a first memory string vertically coupled between a common source line CSL and the pipe transistor of a substrate and a second memory string vertically coupled between a bit line BL and the pipe transistor of the substrate. The first memory string includes a source select transistor SST and memory cells C0 to C7. The source select transistor SST is controlled by a voltage supplied to a source select line SSLa1, and the memory cells C0 to C7 are controlled by a voltage supplied to stacked word lines WLa0 to WLa7. The second memory string includes a drain select transistor DST and memory cells C8 to C15. The drain select transistor DST is controlled by a voltage supplied to a drain select line DSLa1, and memory cells C8 to C15 are controlled by a voltage supplied to stacked word lines WLa8 to WLa15.

In the memory string of the P-BiCS structure, a pipe transistor PT coupled between the pair of memory cells C7 and C8 placed in the middle of the first and the second memory strings functions to electrically couple the channel layers of the first memory strings and the channel layers of the second memory strings which are included in the memory block BLOCKa when the memory block BLOCKa is selected.

Meanwhile, in a memory block having a two-dimensional (2-D) structure, a memory string is coupled to each bit line, and the drain select transistors of the memory block are controlled by a single drain select line at the same time. In the memory block BLOCKa of the 3-D structure, the plurality of memory strings ST is coupled to each bit line BL in common. The number of memory strings ST coupled to one bit line BL in common and controlled by the same word lines in the same memory block BLOCKa may be changed according to different design needs. FIG. 1 shows a 4-string structure in which four memory strings ST are coupled to one bit line BL in common. Since the plurality of memory strings ST is coupled in parallel to the bit line BL, the drain select transistors DST are independently controlled by respective select voltages supplied to the drain select lines DSLa1 to DSLa4 in order to selectively couple the bit line BL and the memory strings ST.

In the memory block BLOCKa, the memory cells C0 to C7 of the first memory string and the memory cells C8 to C15 of the second memory string, each of which are vertically coupled, are controlled by operating voltages supplied to the stacked word lines WLa0 to WLa7 and the stacked word lines WLa8 to WLa15, respectively. The word lines WLa0 to WLa15 are classified for each memory block. That is, the memory cells of the memory block BLOCKa are operated by voltages supplied to the word lines WLa0 to WLa15, and the memory cells of the memory block BLOCKb are operated by voltages supplied to the word lines WLb0 to WLb15. In other words, when the memory block BLOCKa is selected, operating voltages are supplied to the word lines WLa0 to WLa15, and thus the memory cells of the memory block BLOCKa are operated. When the memory block BLOCKb is selected, operating voltages are supplied to the word lines WLb0 to WLb15, and thus the memory cells of the memory block BLOCKb are operated.

In order to supply the operating voltages to the memory string ST having the above structure, at least 21 lines, including 16 lines coupled to the word lines WLa0 to WLa15, 4 lines coupled to the drain select lines DSLa1 to DSLa4, and 1 line coupled to control the pipe transistor PT, are used for each memory block.

Meanwhile, in order to further increase the integration degree, a larger number of memory cells are to be disposed in the same area. In the P-BiCS structure, a larger number of memory cells are vertically coupled. In this case, the number of stacked word lines is increased, and thus, the number of lines for transferring operating voltage to a memory block increases. If the number of lines is increased, however, it becomes difficult to dispose lines since the size of peripheral circuits (for example, a voltage generator and a row decoder) for supplying the operating voltages to the lines is increased and an internal structure design is to be changed to accommodate such a change in the size of peripheral circuits. That is, in order to increase the integration degree, a design of internal structure is significantly changed.

BRIEF SUMMARY

In accordance with the present disclosure, although the number of stacked word lines is increased in order to increase the integration degree, the number of lines for each memory block can be maintained or reduced.

A semiconductor memory device according to an aspect of the present disclosure includes word lines stacked over a substrate in which a plurality of memory block regions is defined, select lines arranged over the highest word lines of the word lines, vertical channel layers formed to penetrate the select lines and the word lines and extended up to the substrate, and a charge trap layer disposed between the word lines and the vertical channel layers, wherein the stacked word lines are separated by each memory block group including two or more memory block regions.

A semiconductor memory device according to another aspect of the present disclosure includes a plurality of memory blocks each configured to include word lines, vertically coupled and stacked between a substrate and lines, and memory strings each including memory cells and select transistors controlled by select lines, and an operation circuit configured to supply operating voltages for a data input/output operation of the memory cells to the stacked word lines, the select lines, and the lines, wherein the memory blocks are classified into a plurality of memory block groups, and the stacked word lines of the memory strings included in different memory blocks within an identical memory block group are interconnected, and the select lines are isolated from one another.

DESCRIPTION OF EMBODIMENTS

Hereinafter, some exemplary embodiments of the present disclosure will be described in detail with reference to accompanying drawings. The figures are provided to allow those having ordinary skill in the art to understand the scope of the embodiments of the disclosure.

Figure 2:
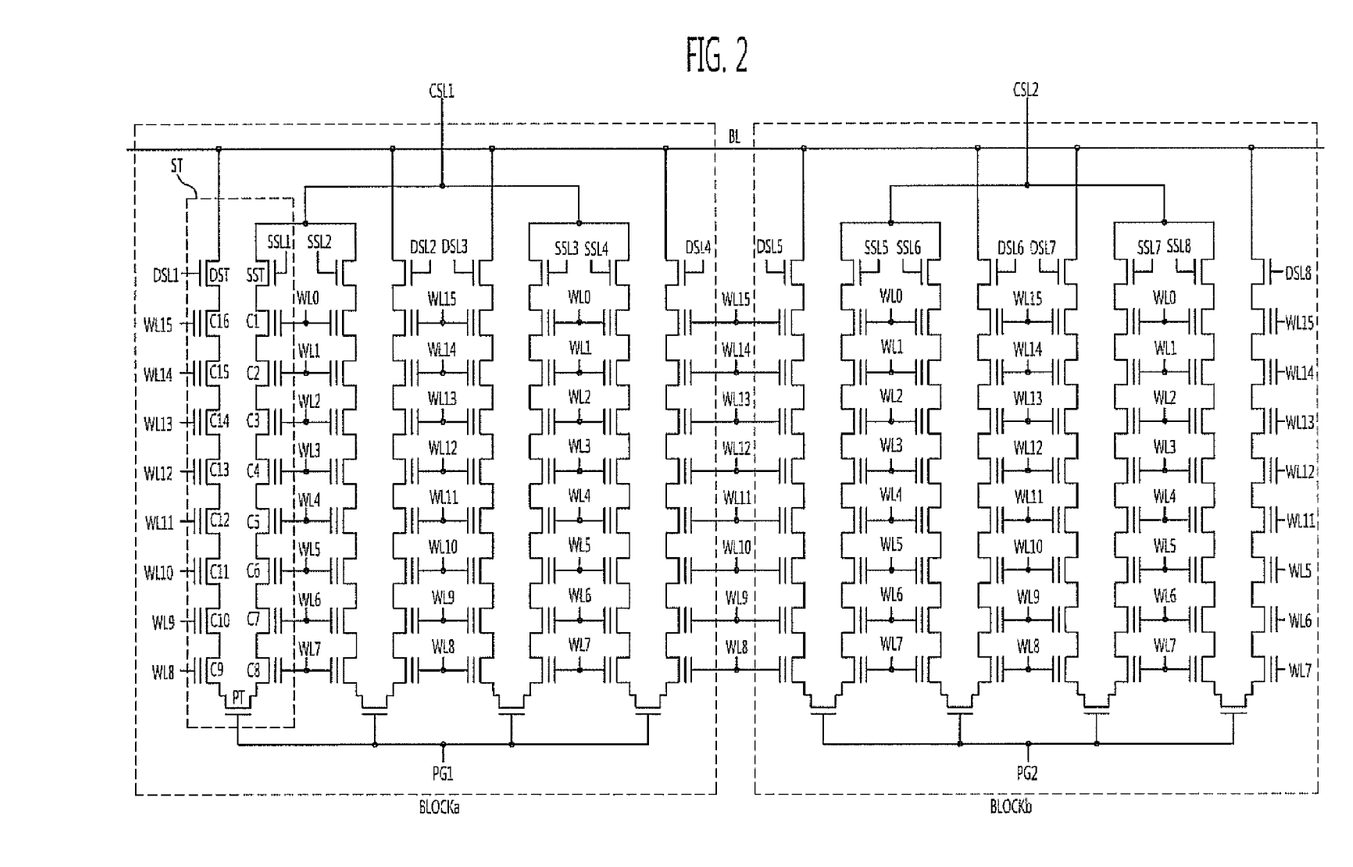
FIG. 2 is a circuit diagram illustrating a memory block having a P-BiCS structure according to an exemplary embodiment of this disclosure.

FIG. 2 is a circuit diagram illustrating a memory block having a P-BiCS structure according to an exemplary embodiment of this disclosure.

Referring to FIG. 2, each of memory blocks BLOCKa and BLOCKb includes a plurality of memory strings ST. Each of the memory strings ST includes a drain select transistor DST having a drain coupled to a bit line BL (only one bit line is shown, for illustration purposes), a source select transistor SST having a source coupled to a common source line CSL1, and a plurality of memory cells C1 to C16 coupled in series between the select transistors (that is, the drain select transistor DST and the source select transistor SST). Here, while the number of memory cells may be changed according to design needs, an exemplary embodiment in which the number of memory cells is 16 is described below.

In the memory string having the P-BiCS structure, a pipe transistor PT is coupled between the pair of memory cells C8 and C9 placed in the middle of the memory string. Accordingly, the source select transistor SST and some (for example, C1 to C8) of the memory cells C1 to C16 included in the memory string are coupled in series between the common source line CSL1 and a substrate (that is, the pipe transistor PT), thus forming a first memory string. The remaining memory cells C9 to C16 and the drain select transistor DST are coupled in series between the bit line BL and the substrate (that is, the pipe transistor PT), thus forming a second memory string.

The pipe transistor PT is formed in the substrate for each memory block. The drain select transistor DST and the memory cells C9 to C16 of the second memory string are arranged in series between the bit line BL and the pipe transistor PT in a vertical direction to the substrate. The source select transistor SST and the memory cells C1 to C8 of the first memory string are arranged in series between the common source line CSL1 and the pipe transistor PT in a vertical direction to the substrate. According to an example, the number of memory cells C1 to C8 of the first memory string is the same as that of the memory cells C9 to C16 of the second memory string. When the memory cells C1 to C16 are vertically arranged, the direction of the channels of the first memory string and the second memory string is vertical to the substrate. Furthermore, when the memory cells C1 to C16 of the memory string ST are divided into the first and the second memory strings, two vertical channel layers vertical to the substrate are included in the memory string ST.

When the memory block BLOCKa is selected, the pipe transistors PT function to electrically couple the channel layers of the first memory strings and the channel layers of the second memory strings which are included in the selected memory block BLOCKa. That is, each of the pipe transistors PT functions to electrically couple the channel region of memory cells C1 to C8, included in the first memory string, and the channel region of the memory cells C9 to C16, included in the second memory string.

Meanwhile, in a memory block having a 2-D structure, a memory string is coupled to each bit line, and the drain select transistors of the memory block are controlled by a single drain select line at the same time. In the memory block BLOCKa having a P-BiCS structure, a plurality of the memory strings ST is coupled to the bit line BL in common. In the same memory block BLOCKa, the number of memory strings ST coupled to the bit line BL may be changed according to design needs.

More specifically, the word lines WL0 to WL15 coupled to the memory blocks BLOCKa and BLOCKb having a known P-BiCS structure are separated from one another. In the present disclosure, however, memory blocks (for example, BLOCKa and BLOCKb) are classified into several memory block groups, and the word lines WL0 to WL15 coupled to memory blocks (for example, BLOCKa and BLOCKb) included in the same memory block group are interconnected. FIG. 2 shows an example in which the two memory blocks BLOCKa and BLOCKb are included in the same memory block group and the stacked word lines WL0 to WL15 of the memory blocks BLOCKa and BLOCKb are interconnected. That is, the memory cells C1 to C16 of the memory strings ST included in the memory blocks BLOCKa and BLOCKb are controlled by the same word lines WL0 to WL15. Accordingly, the number of memory strings ST controlled by the same word lines WL0 to WL15 is 8 for each bit lines BL, and thus a memory block group has a modified 8-string structure.

When the plurality of memory strings ST included in the memory blocks BLOCKa and BLOCKb of the same memory block group is coupled in parallel to the bit line BL, the drain select transistors DST are independently controlled by respective select voltages supplied to the drain select lines DSL1 to DSL8 in order to selectively couple the bit line BL and the plurality of memory strings ST.

When the word lines WL0 to WL15 of the memory blocks BLOCKa and BLOCKb included in the memory block group are interconnected, the memory cells C1 to C16 included in the memory blocks BLOCKa and BLOCKb are controlled by operating voltages supplied to the stacked word lines WL0 to WL15. Here, the operating states of the memory cells C1 to C16 differ depending on the coupling state of the memory string ST and the bit line BL by the drain select transistor DST and a change in voltage supplied to the bit line BL.

When the word lines WL0 to WL15 coupled to the memory blocks BLOCKa and BLOCKb included in the same memory block group are interconnected as described above, the number of lines coupled to the word lines WL0 to WL15 can be reduced. For example, if the word lines coupled to the two memory blocks BLOCKa and BLOCKb are separated from one another, 16 lines to be coupled to the respective word lines of the memory block BLOCKa and 16 lines to be coupled to the respective word lines of the memory block BLOCKb are used. If the word lines of the two memory blocks BLOCKa and BLOCKb are interconnected, however, 16 lines to be coupled to the respective word lines WL0 to WL15 of the memory blocks BLOCKa and BLOCKb may be used. That is, since the number of lines to be coupled to the word lines WL0 to WL15 is 16 for the two memory blocks, the number of lines to be coupled to the two memory blocks can be reduced to half. Accordingly, the number of lines to be coupled to all the word lines can be reduced by half.

As compared with the case where the number of memory strings ST coupled to the bit line BL in the memory block BLOCKa is increased to 8, the data storage capacity of the memory block BLOCKa itself can be reduced, and the number of memory blocks in the same area is reduced by half. If the word lines WL0 to WL15 of the memory blocks BLOCKa and BLOCKb included in the memory block group are interconnected, however, the data storage capacity of the memory block BLOCKa itself and the number of memory blocks in the same area may remain intact.

For another example, if 32 memory cells are included in one memory string ST in order to increase the integration degree, 16 memory cells are vertically coupled between the bit line BL and the substrate or between the common source line CSL1 and the substrate, and 32 word lines are used in order to control the 32 memory cells. When the number of word lines is 32, the number of lines to be coupled to the respective word lines is also 32. If the number of memory blocks included in the memory block group is 4, however, the number of lines to be coupled to the word lines WL0 to WL15 is 32 for the four memory blocks. Thus, the average number of lines to be coupled to the word lines per each memory block is reduced to 8. Accordingly, although the number of word lines is increased because the number of memory cells vertically coupled in the same area is increased in order to increase the integration degree, the number of lines to be coupled to all the word lines may remain intact or may be reduced by increasing the number of memory blocks that share word lines in a memory block group. In this structure, the number of memory strings controlled by the same word lines for each bit lines BL is 16, and thus the memory block group has a modified 16-string structure.

The structure of one of the memory blocks shown in FIG. 2 is described in more detail below.

Figure 3A:
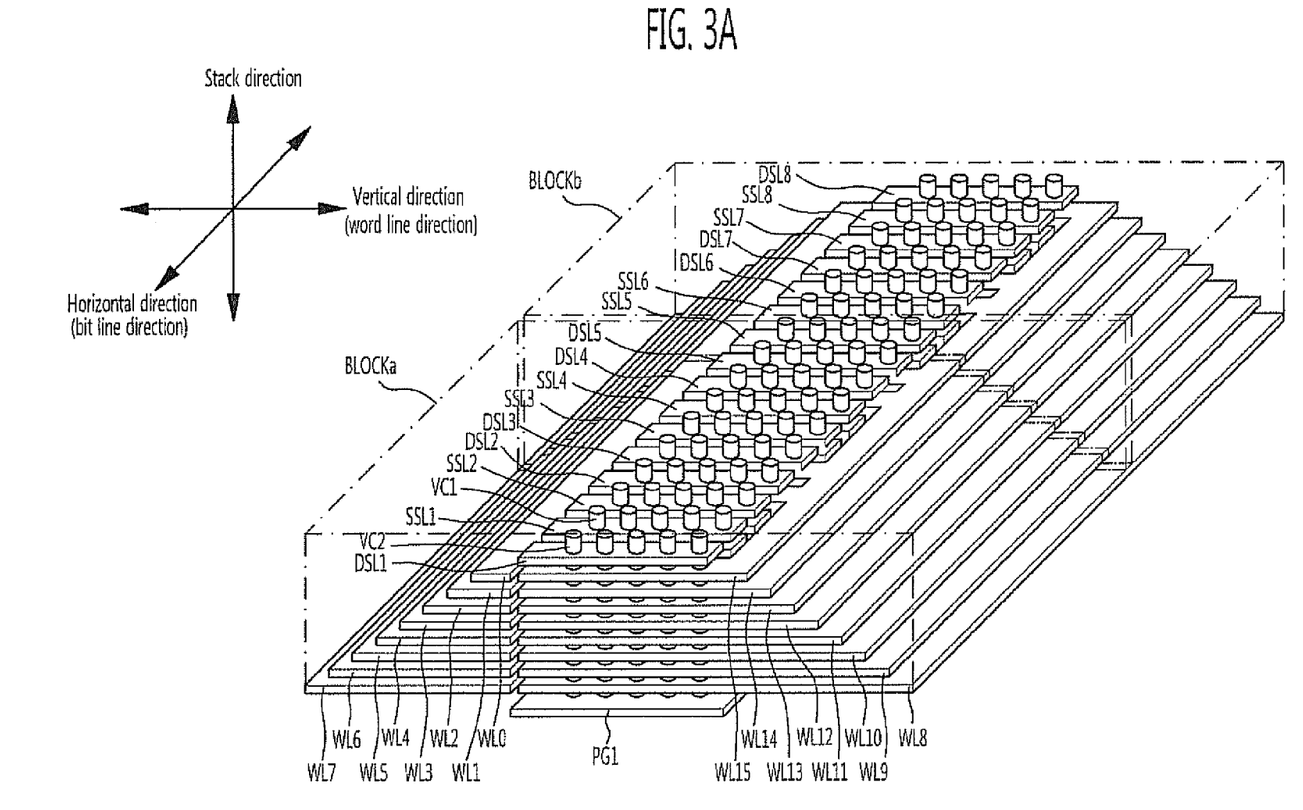
FIGS. 3A to 3D are 3-D diagrams illustrating the memory block having a P-BiCS structure according to an exemplary embodiment of this disclosure.
Figure 3B:
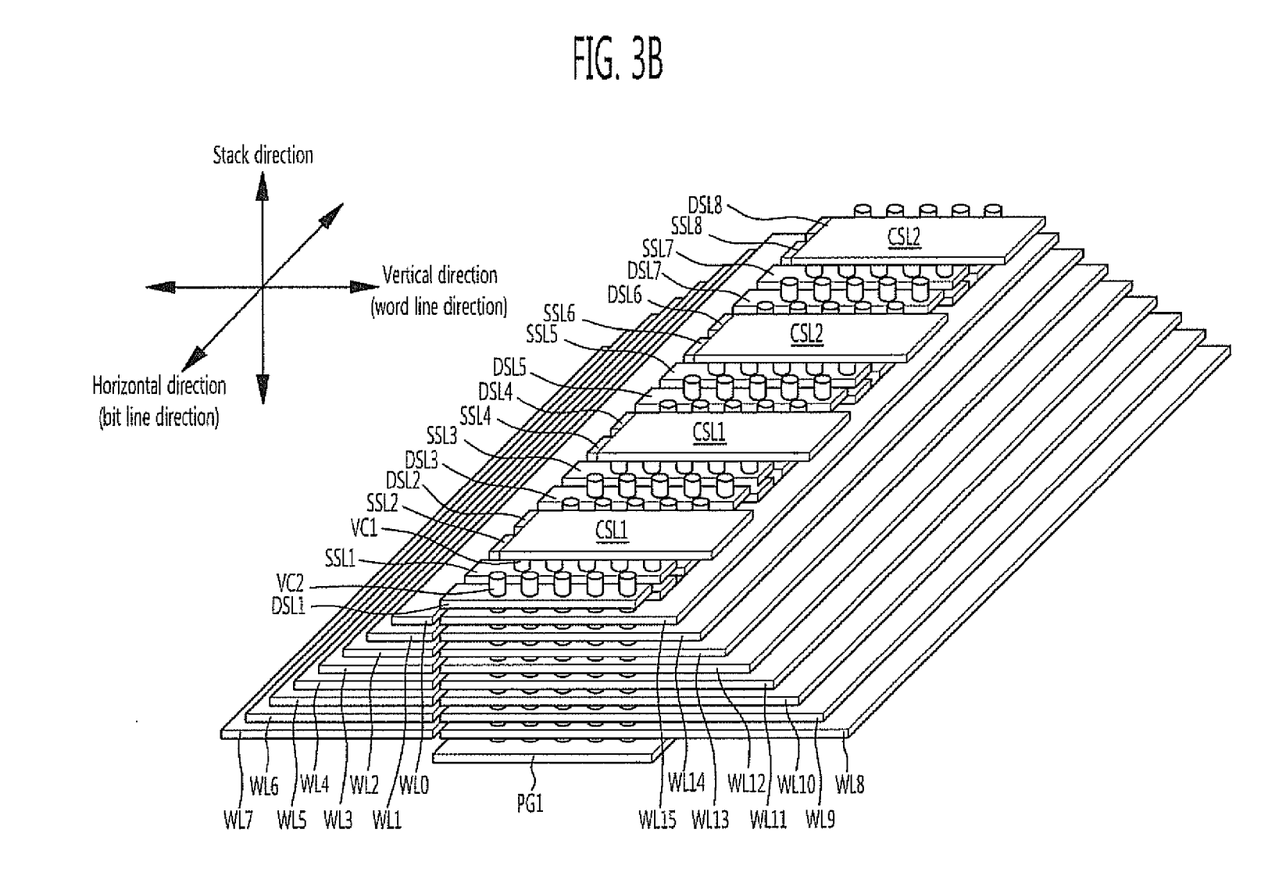
Figure 3C:
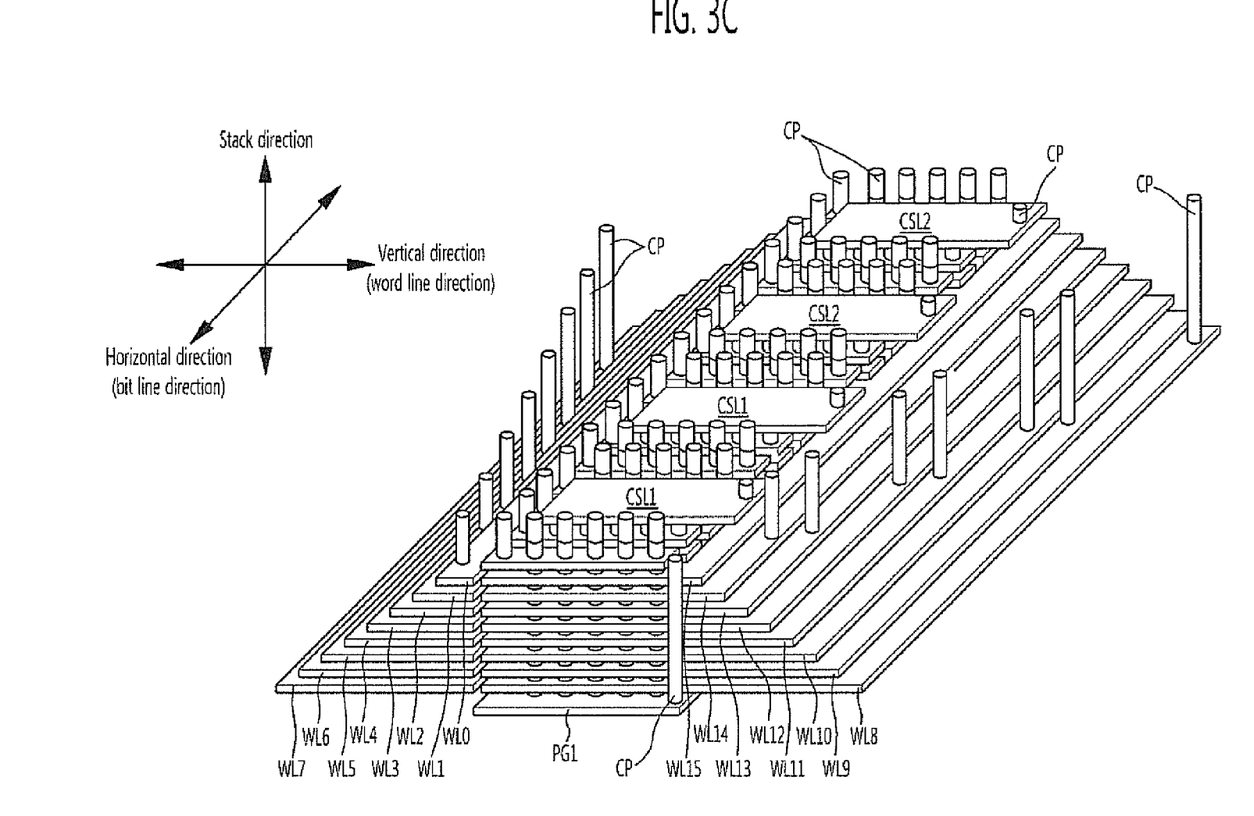
Figure 3D:
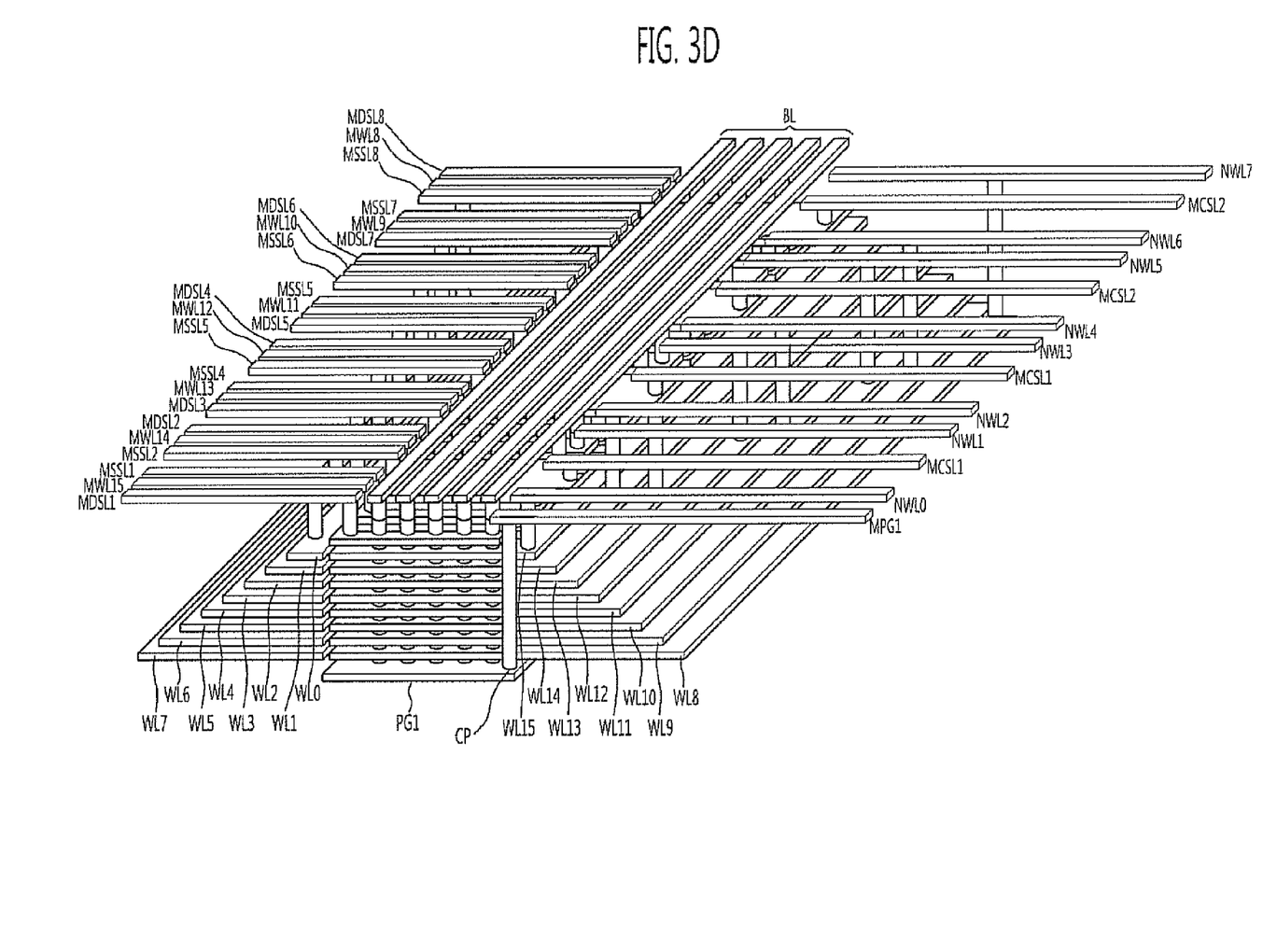
Figure 4A:
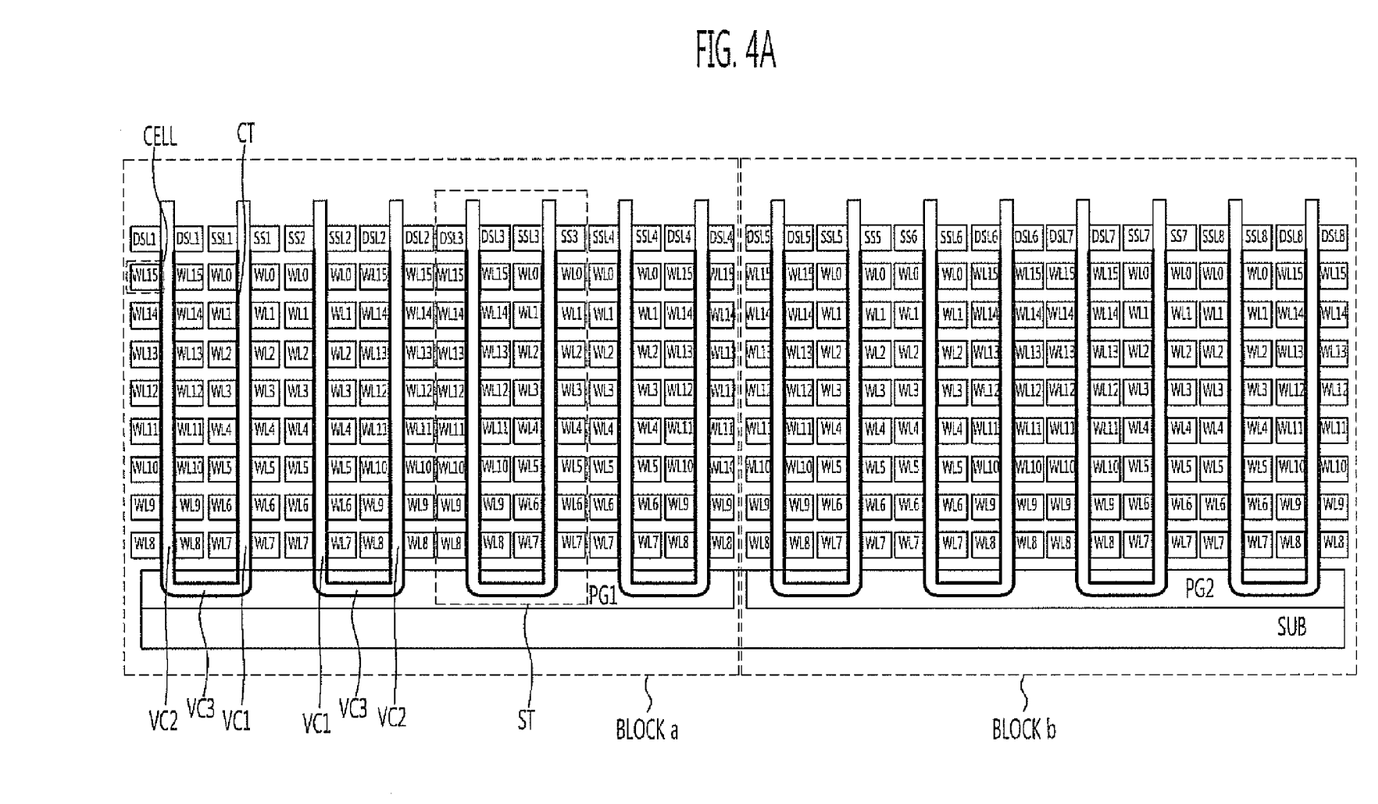
FIGS. 4A and 4B are sectional views showing states in which the memory block shown in FIG. 3D are cut away in the direction of bit lines.
Figure 4B:
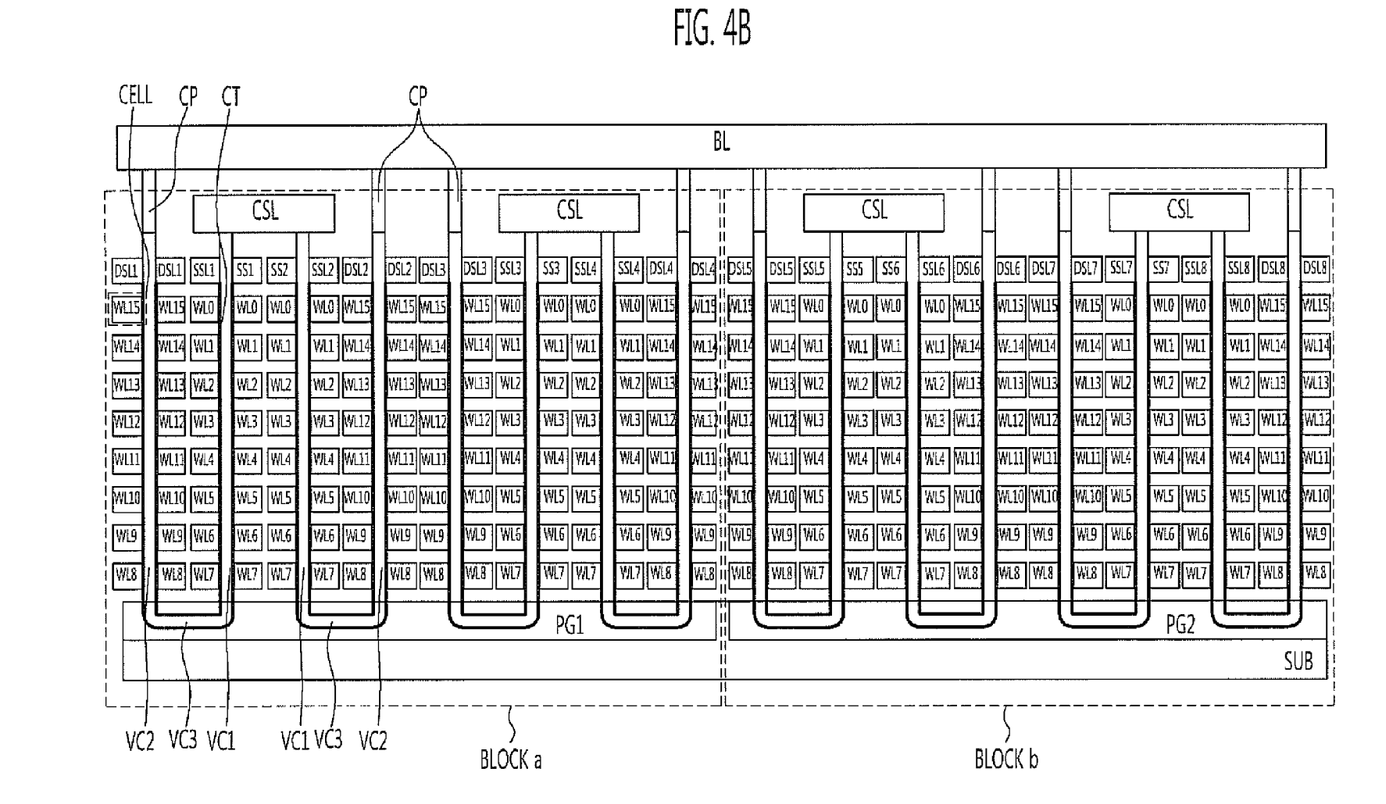

FIGS. 3A to 3D are 3-D diagrams illustrating the memory block having a P-BiCS structure according to an exemplary embodiment of this disclosure, and FIGS. 4A and 4B are sectional views showing states in which the memory block shown in FIG. 3D are cut away in the direction of bit lines.

Referring to FIGS. 3A and 4A, if a plurality of memory block regions is defined in a substrate SUB and two memory blocks BLOCKa and BLOCKb are formed in each of the memory block regions, pipe gates PG1 and PG2 of pipe transistors are formed in each memory block region of the substrate SUB. An insulating layer (not shown) may be formed between the pipe gates PG1 and PG2 and the substrate SUB.

Word lines WL0 to WL15 are stacked over the substrate SUB in which the pipe gates PG1 and PG2 are formed. An insulating layer (not shown) for isolating an upper word line and a lower word line from each other is formed between the stacked word lines. Since a pair of word lines (for example, WL0 and WL15) are formed on the same layer, the number of layers over which the word lines WL0 to WL15 are stacked is 8. That is, the eighth to first word lines WL7 to WL0 are sequentially stacked, and the ninth to $16^{th}$ word lines WL8 to WL15 are sequentially stacked so that they face the eighth to first word lines WL7 to WL0, respectively, on the respective layers.

A pair of word lines (for example, WL15 and WL0) are symmetrical to each other in each layer. More particularly, the word line WL15 extends in the direction of the word lines crossing the direction of the bit line BL and has a comb shape having one end coupled to another. Furthermore, the word line WL0 formed in the same layer as the word line WL15 has a comb shape symmetrical to the word line WL15. The pair of word lines WL15 and WL0 symmetrical to each other with respect to the channel placed in-between.

Meanwhile, one ends of the stacked word lines WL7 to WL0 and the other ends of the stacked word lines WL8 to WL15 are stepwise formed by a slimming process. Accordingly, the corners of word lines disposed on the lower side are more protruded than the corners of word lines disposed on the upper side.

Select lines are arranged over the highest word lines WL0 and WL15. More particularly, drain select lines DSL1 to DSL8 and source select lines SSL1 to SSL8 extending in the direction that the word lines extend are alternately arranged over the highest word lines WL0 and WL15 in the direction of the bit line BL. In this case, the two drain select lines and the two source select lines may be alternately arranged.

In particular, the word lines WL0 to WL15 are included in each memory block group. That is, the word lines WL0 to WL15 of the memory blocks BLOCKa and BLOCKb included in the memory block group are interconnected, and thus the memory blocks BLOCKa and BLOCKb share the word lines WL0 to WL15. Furthermore, the word lines of memory blocks included in different memory block groups are separated from each other.

First and second vertical channel layers VC1 and VC2 are formed to penetrate the select lines DSL1 to DSL8 and SSL1 to SSL8 and the stacked word lines WL7 to WL0 and WL8 to WL15. The first vertical channel layer VC1 is formed to penetrate the source select lines SSL1 to SSL8 and the stacked word lines WL7 to WL0, and the second vertical channel layer VC2 is formed to penetrate the drain select lines DSL1 to DSL8 and the stacked word lines WL8 to WL15. The pipe gate PG1 is equipped with a horizontal channel layer VC3 for coupling the first and the second vertical channel layers VC1 and VC2. Whether the first and the second vertical channel layers VC1 and VC2 included in the memory block BLOCKa will be coupled or not is controlled by a voltage supplied to the pipe gate PG1. The channel layer of the memory string ST has a U shape formed by the first and the second vertical channel layers VC1 and VC2 and the horizontal channel layer VC3.

Meanwhile, the number of bit lines is determined by the number of vertical channel layers VC1 or VC2 which are arranged in the direction of the bit line BL (that is, the direction that the bit lines BL extend) and formed to penetrate a drain select line (for example, DSL1) or a source select line (for example, SSL1).

A charge trap layer CT is disposed between the word lines WL0 to WL15 and the vertical channel layers VC1 and VC2.

A tunnel insulating layer is disposed between the charge trap layer CT and the vertical channel layers VC1 and VC2, and a blocking insulating layer is further disposed between the charge trap layer CT and the word lines WL0 to WL15. Thus, a memory cell CELL is formed of the word line, the blocking insulating layer, the charge trap layer, the tunnel insulating layer, and the vertical channel layer.

Referring to FIGS. 3B and 4B, common source lines CSL1 to CSL4 are formed to couple the upper parts of the vertical channel layers VC1 and VC2 which penetrate adjacent source select lines (for example, SSL1 and SSL2).

Referring to FIGS. 3C and 4B, contact plugs CP are formed at the ends of the word lines WL0 to WL15 and over the vertical channel layers VC1 and VC2, the pipe gates PG1 to PG4, and the common source lines CSL1 to CSL4. Top surfaces of the contact plugs CP are at the same height.

Referring to FIGS. 3D and 4B, lines MWL0 to MWL15 coupled to the respective contact plugs CP of the word lines WL0 to WL15, lines MDSL1 to MDSL8 coupled to the respective contact plugs CP of the drain select lines DSL1 to DLS8, lines MCSL1 to MCSL4 coupled to the respective contact plugs CP of the common source lines CSL1 to CSL4, a line MPG1 coupled to the contact plug CP of the pipe gate PG1, and the bit lines BL coupled to the contact plugs CP over the vertical channel layers VC2 are formed. Here, the contact plugs CP over the vertical channel layers VC2 penetrating through the same drain select line are coupled to different bit lines BL. Furthermore, each of the bit lines BL is coupled the contact plugs CP formed over the vertical channel layers VC2 included in different strings.

An insulating layer (not shown) for electrically isolating lines from each other is formed between the lines.

In the above structure, the number of lines MWL0 to MWL15 coupled to the word lines WL0 to WL15 in the two memory blocks BLOCKa and BLOCKb is 16. That is, the number of word lines WL0 to WL15 is 16, but the number of lines coupled to word lines for each memory block is 8. Accordingly, the number of lines may be reduced.

When the memory blocks BLOCKa and BLOCKb within the memory block group share the word lines WL0 to WL15 as described above, the internal structure of an operation circuit for supplying operating voltages for data input and output to a select line (particularly, a drain select line) and the word lines WL0 to WL15 are changed. This is described in detail below.

Figure 5A:
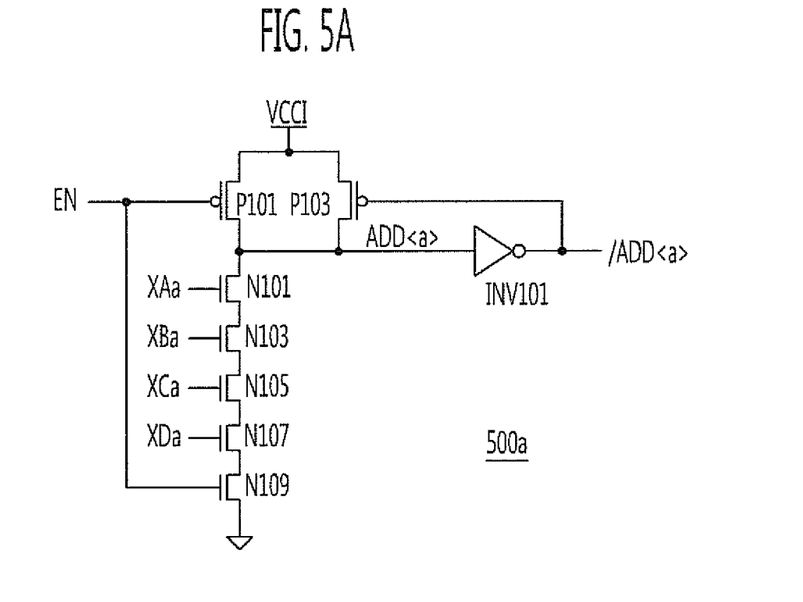
FIGS. 5A and 5B are circuit diagrams for illustrating row decoders of the semiconductor memory devices according to exemplary embodiments of this disclosure.
Figure 5B:
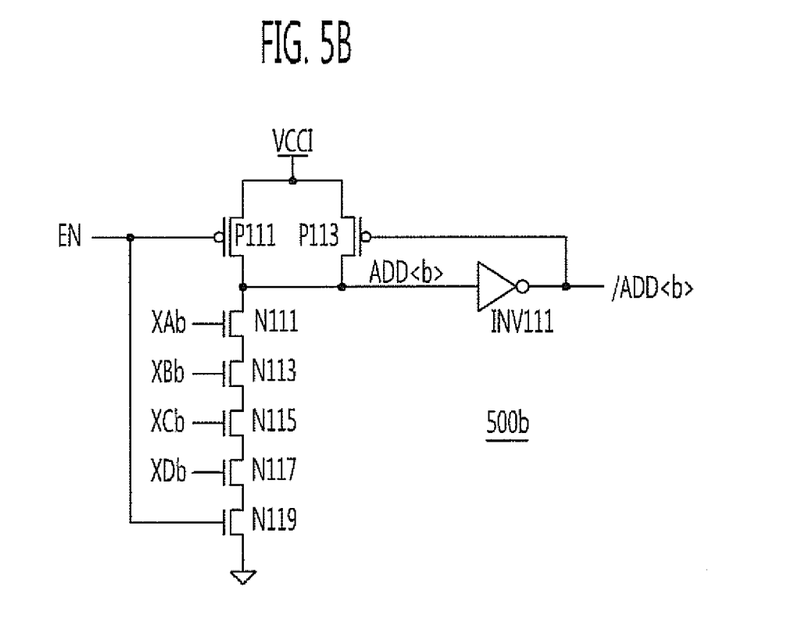

FIGS. 5A and 5B are circuit diagrams for illustrating row decoders of the semiconductor memory devices according to exemplary embodiments of this disclosure.

In the row decoder of FIG. 5A, a circuit 500a for generating a block select signal ADD<a> for the memory block BLOCKa is operated in response to address signals XAa, XBa, XCa, and XDa and an enable signal EN. More particularly, the circuit 500a includes a transistor P101 coupled to a power source terminal VCCI and operated in response to the enable signal EN, a transistor N109 coupled to a ground terminal and operated in response to the enable signal EN, transistors N101, N103, N105, and N107 coupled in series between the transistors P101 and N109 and operated in response to the address signals XAa, XBa, XCa, and XDa, respectively, an inverter INV101 configured to invert the level of voltage of the node of the transistors P101 and N101, and a transistor P103 coupled between the power source terminal VCCI and the node of the transistors P101 and N101 and operated in response to the output signal of the inverter INV101. When the memory block BLOCKa is selected, the transistors P101 and N109 are turned on in response to the enable signal EN, and the transistors N101 to N107 are turned on in response to the address signals XAa, XBa, XCa, and XDa. Thus, the block select signal ADD<a> of a low level is outputted to the node of the transistors P101 and N101. The inverter INV101 outputs an inverted block select signal/ADD<a> in response to the block select signal ADD<a>.

In the row decoder of FIG. 5B, a circuit 500b for generating a block select signal ADD<b> for the memory block BLOCKb may have the same construction as the circuit 500a of FIG. 5A except that transistors N111, N113, N115, and N117 are operated in response to the address signals XAb, XBb, XCb, and XDb, respectively, of the memory block BLOCKb, not the address signals XAa, XBa, XCa, and XDa of FIG. 5a. As a result, the circuit 500b outputs the block select signal ADD<b> for selecting the memory block BLOCKb in response to the address signals XAb, XBb, XCb, and XDb.

Figure 6A:
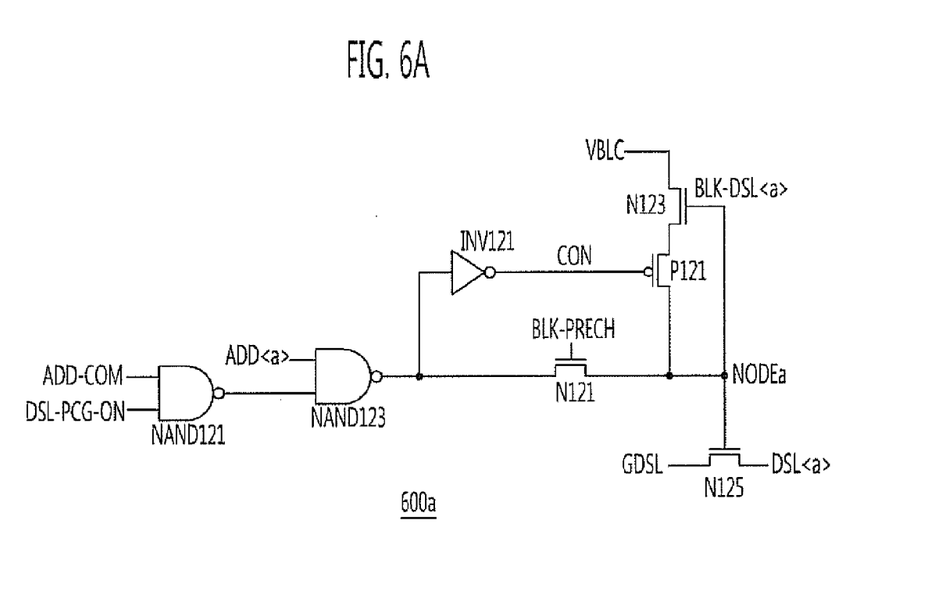
FIGS. 6A to 6C are circuit diagrams for illustrating coupling circuits of the semiconductor memory devices according to exemplary embodiments of this disclosure.
Figure 6B:
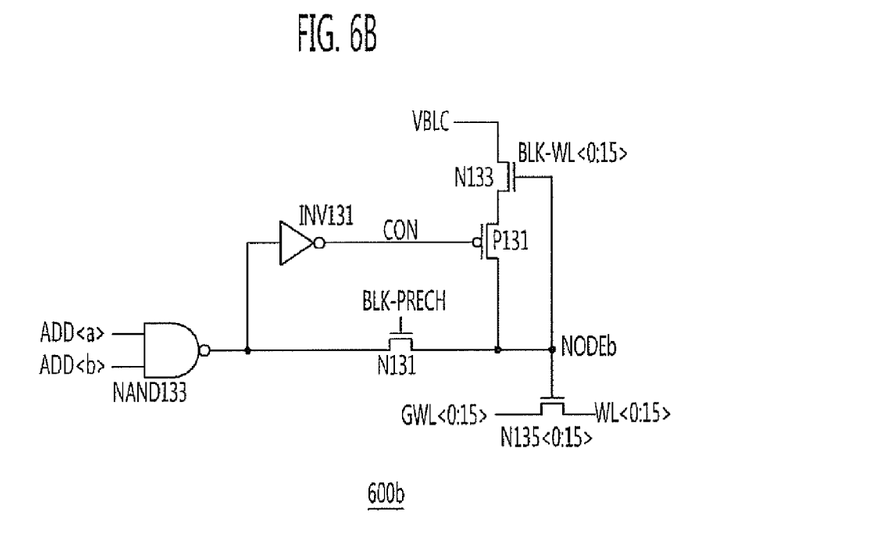
Figure 6C:
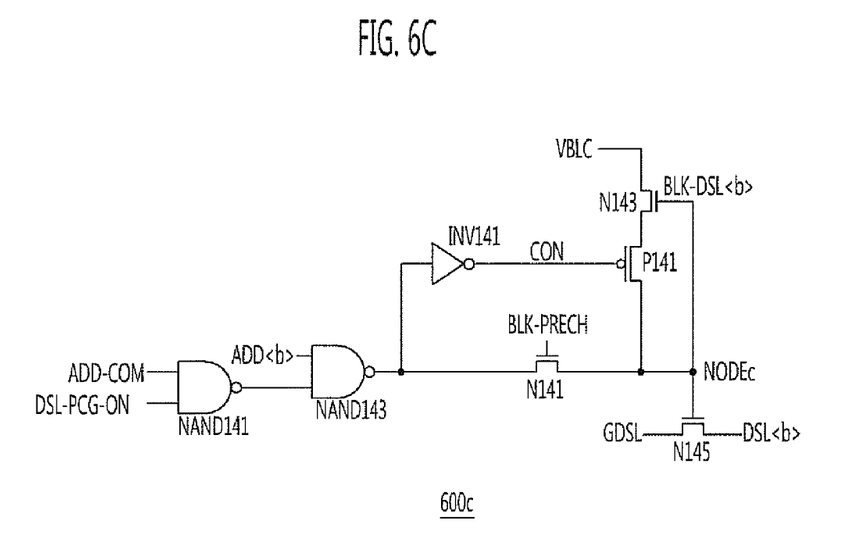

FIGS. 6A to 6C are circuit diagrams for illustrating coupling circuits of the semiconductor memory devices according to exemplary embodiments of this disclosure.

Referring to FIG. 6A, a select line coupling circuit 600a couples the drain select line DSL<a> of the memory block BLOCKa and a global drain select line GDSL in response to the block select signal ADD<a>. The select line coupling circuit 600a includes a NAND gate NAND121 operated in response to control signals ADD-COM and DSL-PCG-ON, a NAND gate NAND123 operated in response to the block select signal ADD<a> and the output signal of the NAND gate NAND121, an inverter INV121 configured to invert the output signal of the NAND gate NAND123, a transistor N121 coupled between the output terminal of the NAND gate NAND123 and a node NODEa and operated in response to a control signal BLK_PRECH, a transistor P121 coupled to the node NODEa and operated in response to the output signal CON of the inverter INV121, a transistor N123 coupled between the input terminal of a high voltage VBLC and the transistor P121 and operated in response to the level of voltage of the node NODEa, and a transistor N125 configured to couple the drain select line DSL<a> and the global drain select line GDSL in response to the level of voltage of the node NODEa. Here, the transistor N121 functions to precharge the node NODEa before the high voltage VBLC is supplied and to prevent voltage of the node NODEa, rising due to the high voltage VBLC, from being transferred to the NAND gate NAND123. Furthermore, the transistor N123 has a threshold voltage of a negative potential so that the high voltage VBLC can be transferred to the node NODEa without a voltage drop.

The select line coupling circuit 600a constructed as above couples the drain select line DSL<a> of a memory block and the global drain select line GDSL in response to the control signals ADD-COM and DSL-PCG-ON and the block select signal ADD<a>.

Like in the select line coupling circuit 600a, a circuit for coupling a source select line and a global select line may be applied as shown below.

Referring to FIG. 6B, a word line coupling circuit 600b couples global word lines GWL0 to GWL15 and the word lines WL0 to WL15 of the memory blocks BLOCKa and BLOCKb, belonging to the same memory block group, in response to block select signals ADD<a> and ADD<b>. The word line coupling circuit 600b includes a NAND gate NAND133 operated in response to the block select signals ADD<a> and ADD<b>, an inverter INV131 configured to invert the output signal of the NAND gate NAND133, a transistor N131 coupled between the output terminal of the NAND gate NAND123 and a node NODEb operated in response to a control signal BLK_PRECH, a transistor P131 coupled to the node NODEb and operated in response to the output signal CON of the inverter INV131, a transistor N133 coupled between the input terminal of a high voltage VBLC and the transistor P131 and operated in response to the level of voltage of the node NODEb, and transistors N135<0:15> configured to couple the respective word lines WL0 to WL15 and the respective global word lines GWL0 to GWL15 in response to the level of voltage of the node NODEb. Here, the transistor N131 functions to precharge the node NODEb before the high voltage VBLC is supplied and to prevent voltage of the node NODEb, rising due to the high voltage VBLC, from being transferred to the NAND gate NAND133. Furthermore, the transistor N133 has a threshold voltage of a negative potential so that the high voltage VBLC can be transferred to the node NODEb without a voltage drop.

The word line coupling circuit 600b constructed as above couples the word lines WL0 to WL15 of the memory blocks, included in the memory block group, and the global word lines GWL0 to GWL15 in response to the block select signals ADD<a> and ADD<b>. In particular, since the word lines WL0 to WL15 of the memory blocks included in the memory block group are interconnected, the word lines WL0 to WL15 of all the memory blocks included in the memory block group are coupled to the global word lines GWL0 to GWL15, although one of the memory blocks included in the memory block group is selected.

Referring to FIG. 6C, a select line coupling circuit 600c couples the drain select line DSL<b> of the memory block BLOCKb and a global drain select line GDSL in response to the block select signal ADD<b>. The select line coupling circuit 600c of FIG. 6C has the same construction as the select line coupling circuit 600a of FIG. 6A except that it couples the drain select line DSL<b> of the memory block BLOCKb and the global drain select line GDSL in response to the block select signal ADD<b>, not the block select signal ADD<a> used in the select line coupling circuit 600a.

Like in the select line coupling circuit 600b, a circuit for coupling a source select line and a global select line may be applied as shown below.

Figure 7:
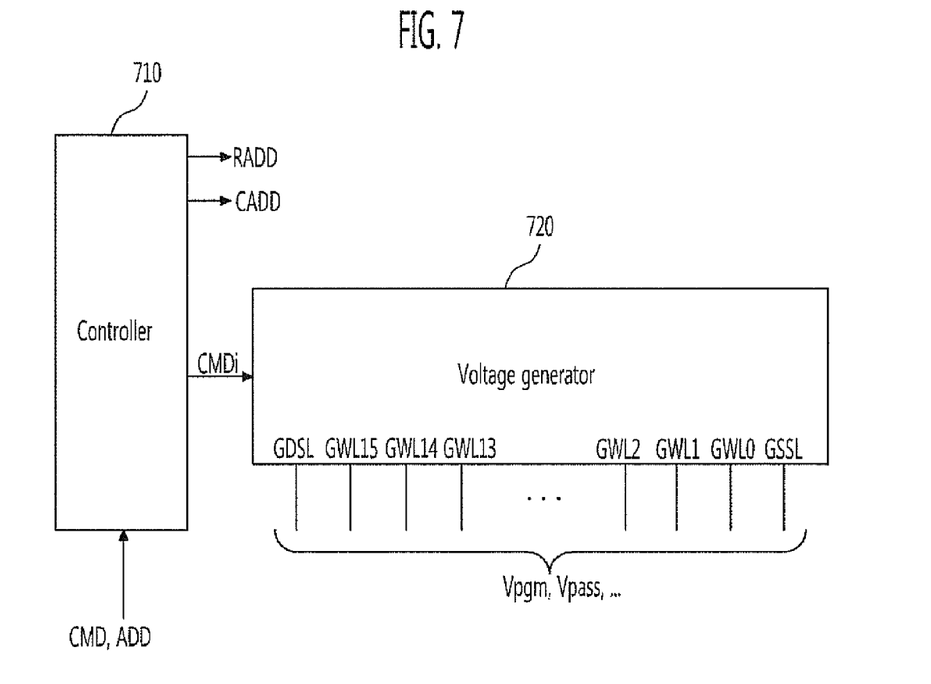
FIG. 7 is a block diagram for illustrating a controller and a voltage generator of the semiconductor memory device according to an exemplary embodiment of this disclosure.

FIG. 7 is a block diagram for illustrating a controller and a voltage generator of the semiconductor memory device according to an exemplary embodiment of this disclosure.

Referring to FIG. 7, the controller 710 generates an internal command signal CMDi, a row address signal RADD, and a column address signal CADD in response to an external command signal CMD and an external address signal ADD. Here, the row address signal RADD includes the address signals XAa to XDa and XAb to XDb shown in FIGS. 5A to 5C. The column address signal CADD may be used to select bit lines.

The voltage generator 720 generates operating voltages for the data input and output of memory cells to global lines GSSL, GWL0 to GWL15, and GSSL in response to the internal command signal CMDi of the controller 710. For example, in a program operation, the voltage generator 720 may output a program voltage Vpgm to a selected global word line and a program pass voltage Vpass to unselected global word lines in response to the internal command signal CMDi. While only one global drain select line GDSL and one global source select line GSSL are shown in FIG. 7, the number of each of the global select lines GDSL and GSSL may be plural because the plurality of select lines DSL1 to DSL8 and SSL1 to SSL8 is included in FIG. 2.

The operation of the semiconductor memory device is described below.

Figure 8:
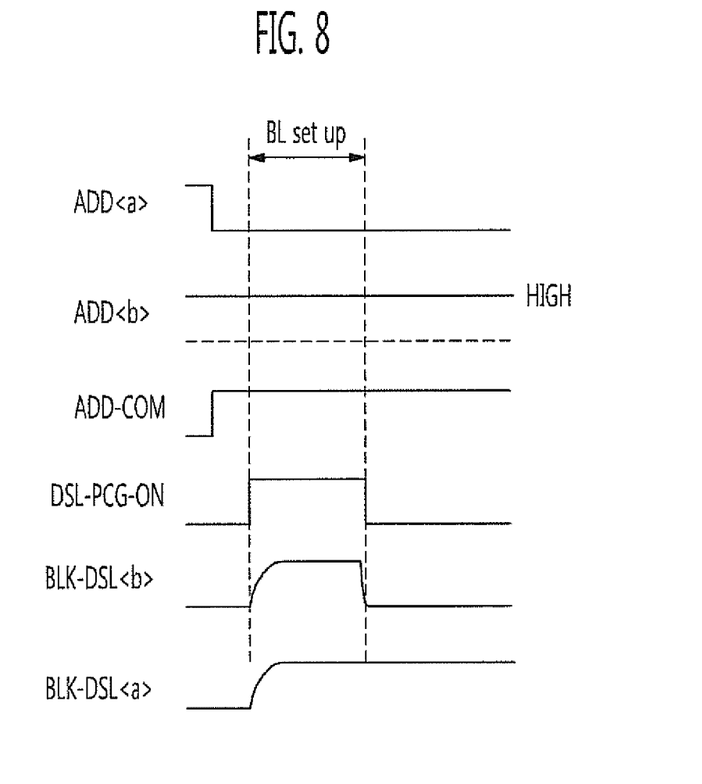
FIG. 8 shows waveforms for illustrating the program operation of the semiconductor memory device according to an exemplary embodiment of this disclosure.

FIG. 8 shows waveforms for illustrating the program operation of the semiconductor memory device according to an exemplary embodiment of this disclosure.

Referring to FIGS. 2, 5A, 5B, 6A to 6C, and 8, if the memory block BLOCKa of the memory blocks included in the memory block group is selected, the circuits 500a and 500b generate the block select signal ADD<a> of a low level and the block select signal ADD<b> of a high level. Furthermore, in a bit line (BL) setup section, the control signals ADD-COM and DSL-PCG-ON are enabled in a high level. As a result, the select line coupling circuits 600a and 600c couple a global select line (particularly, a global drain select line) and the select lines (particularly, the drain select lines) of the memory blocks included in the memory block group. Furthermore, the word line coupling circuit 600b couples the word lines WL0 to WL15 of the memory block group and the global word lines GWL0 to GWL15 in response to the block select signals ADD<a> and ADD<b>. During the BL setup section, a voltage of the bit line is controlled for a program operation, and the voltage generator 720 supplies a precharge voltage VDC of about 2.3 V to the drain select lines DSL<a> and DSL<b> through the global drain select line.

After the BL setup section is finished, the control signal DSL-PCG-ON is disabled in a low level. Accordingly, the select line coupling circuit 600a keeps the coupled state of the drain select line DSL<a> of the selected memory block BLOCKa and the global drain select line GDSL in response to the control signal ADD-COM of a high level and the block select signal ADD<a> and the control signal DSL-PCG-ON of a low level. However, the select line coupling circuit 600b blocks a connection between the drain select line DSL<b> of the unselected memory block BLOCKb, included in the memory block group, and the global drain select line GDSL in response to the control signal ADD-COM and the block select signal ADD<b> of a high level and the control signal DSL-PCG-ON of a low level.

Next, operating voltages are supplied for the program operation as shown in Table 1 below.

TABLE 1

| | | Sel. Block Group | | Unsel. Block Groups (not shown) | |
| --- | --- | --- | --- | --- | --- |
| | | Sel. Block (even) | Unsel. Block (odd) | Unsel. Block (even) | Unsel. Block (odd) |
| WL | Sel. WL | Vpgm | Vpgm | Floating | Floating |
| | Unsel. WL | Vpass | Vpass | Floating | Floating |
| BL | | 0 V | 0 V | 0 V | 0 V |
| DSL | Sel. DSL | VDC (2.3 V) | 0 V after VDC only during BL setup section | 0 V | 0 V |
| | Unsel. DSL | 0 V after VDC | 0 V after VDC | 0 V | 0 V |

TABLE 1-continued

|  |  | Sel. Block Group | | Unsel. Block Groups (not shown) | |
| --- | --- | --- | --- | --- | --- |
|  |  | Sel. Block (even) | Unsel. Block (odd) | Unsel. Block (even) | Unsel. Block (odd) |
| SSL | Sel. SSL | only during BL setup section 0 V | only during BL setup section 0 V | 0 V | 0 V |
|  | Unsel. SSL | 0 V | 0 V | 0 V | 0 V |
| CSL |  | VDC (2.3 V) | VDC (2.3 V) | VDC (2.3 V) | VDC (2.3 V) |
| Pipe Gate |  | Vpass | 0 V | 0 V | 0 V |

If a memory cell is sought to be programmed, a program permission voltage (for example, a ground voltage 0 V) is supplied to a bit line coupled to the memory cell. The ground voltage is supplied to the source select lines SSL regardless of whether a relevant memory block has been selected or not, and the precharge voltage VDC of a positive potential is supplied to the common source line CSL. Furthermore, the pass voltage Vpass is supplied to the pipe gate of a selected memory block (for example, BLOCKa), and thus a first memory string between the common source line CSL and the pipe transistor and a second memory string between the bit line BL and the pipe transistor are electrically coupled. The ground voltage 0 V is supplied to the pipe gate of an unselected memory block (for example, BLOCKb).

In the selected memory block group, the memory blocks BLOCKa and BLOCKb share the word lines WL0 to WL15. Thus, the same operating voltages are supplied to the word lines WL0 to WL15 of all the memory blocks BLOCKa and BLOCKb within the selected memory block group regardless of whether the memory block group has been selected or not. For example, the program voltage Vpgm may be supplied to a selected word line Sel.WL, and the program pass voltage Vpass may be supplied to unselected word lines Unsel.WL. Here, since the select voltage continues to be supplied to the selected drain select line Sel.DSL of the selected memory block BLOCKa, a selected memory string is coupled to the bit line, and thus a program operation is performed on the selected memory string. However, since 0 V is supplied to the unselected drain select line Unsel.DSL of the selected memory block BLOCKa and the drain select lines of the unselected memory block BLOCKb after the BL setup section, the program operation is not performed on unselected memory strings.

Meanwhile, the word lines of other memory block groups excluding the selected memory block BLOCKa are set in the floating state, and the ground voltage 0 V is supplied to the select lines and the pipe gate of other memory block groups. Since the common source lines CSL may be generally controlled identically irrespective of a memory block group, a voltage of a positive potential may be supplied to the common source lines CSL of other memory block groups.

In accordance with this disclosure, although memory blocks within a memory block group share word lines, a program operation may be selectively performed on the memory blocks. In this state, if a method of controlling select lines is applied, a read operation may also be performed on a memory block selected from the memory blocks sharing the word lines.

Furthermore, although the number of word lines stacked in order to increase the integration degree is increased, the arrangement of lines or a change in the design of the internal structure of peripheral circuits may be easily performed and an increase in the size of the peripheral circuits may be minimized by maintaining or reducing the number of lines for each memory block.

What is claimed is:

1. A semiconductor memory device, comprising:
   word lines stacked over a substrate having memory block groups each including a plurality of memory blocks;
   select lines arranged over the word lines;
   vertical channel layers formed to penetrate through the select lines and the word lines and extending to the substrate; and
   a charge trap layer disposed between the word lines and the vertical channel layers,
   wherein the stacked word lines are separated by the memory block groups so that the plurality of memory blocks included in each of the memory block groups share the stacked word lines.

2. The semiconductor memory device of claim 1, further comprising pipe transistors disposed in the substrate and configured to electrically couple bottoms of the vertical channel layers.

3. The semiconductor memory device of claim 2, wherein each of the pipe transistors couples the bottoms of a pair of the vertical channel layers in a respective one of the memory blocks.

4. The semiconductor memory device of claim 1, wherein the select lines comprise drain select lines and source select lines which are arranged in each of the memory blocks.

5. The semiconductor memory device of claim 1, further comprising:
   common source lines coupled to upper parts of first vertical channel layers of the vertical channel layers; and
   bit lines coupled to upper parts of second vertical channel layers of the vertical channel layers.

6. The semiconductor memory device of claim 5, wherein the stacked word lines comprise:
   first stacked word lines through which each of the first vertical channel layers passes, and
   second stacked word lines through which each of the second vertical channel layers passes.

7. The semiconductor memory device of claim 1, wherein the stacked word lines comprises:
   first stacked word lines, wherein a vertical channel layer of the vertical channel layers penetrates through the first stacked word lines and a drain select line of the select lines, and
   second stacked word lines, wherein another vertical channel layer of the vertical channel layers penetrates through the second stacked word lines and a source select line of the select lines.

8. A semiconductor memory device, comprising:
   a plurality of memory blocks that each include word lines and memory strings, wherein the memory strings each include memory cells and select transistors controlled by select lines and the word lines are vertically coupled and stacked between a substrate and a plurality of lines; and an operation circuit configured to supply operating voltages for a data input/output operation of the memory cells to the stacked word lines, the select lines, and the plurality of lines, wherein the plurality of memory blocks are divided into a plurality of memory block groups, memory blocks included in each of the plurality of memory block groups share the stacked word lines, the stacked word lines are separated by the plurality of memory block groups, and the select lines are isolated from one another.

9. The semiconductor memory device of claim 8, wherein each of the memory blocks comprises:

first memory strings vertically coupled between a substrate and a common source line from among the plurality of lines;

second memory strings vertically coupled between the substrate and bit lines from among the plurality of lines; and pipe transistors disposed in the substrate and configured to each couple bottoms of vertical channel layers included in the first and the second memory strings.

10. The semiconductor memory device of claim 8, wherein the operation circuit comprises:

a row decoder configured to generate a block select signal in response to address signals;

a voltage generator configured to generate the operating voltages to global word lines and global select lines in response to an internal command signal; and a line coupling circuit configured to control coupling between the global word lines and the word lines of the memory blocks included in each of the memory block groups and coupling between the select lines and the global select lines in response to an address signal and a coupling control signal.

11. The semiconductor memory device of claim 10, wherein in a program operation, the voltage generator is configured to:

supply a select voltage to global drain select lines coupled to drain select lines selected from the select lines of a selected memory block, and supply the select voltage to unselected global drain select lines coupled to unselected drain select lines in a bit line setup section.

12. The semiconductor memory device of claim 11, wherein in the program operation, the voltage generator is configured to:

supply a program voltage to a global word line coupled to a word line selected from the word lines of the memory block group, supply a program pass voltage to unselected global word lines coupled to unselected ones of the word lines, and supply the select voltage to the global select lines coupled to source select lines selected from the select lines.

13. The semiconductor memory device of claim 10, wherein the line coupling circuit comprises:

a word line coupling circuit configured to couple the global word lines and the word lines of the memory block group, including a selected memory block, in response to the block select signals; and a select line coupling circuit configured to control coupling between the global select lines and the select lines of the memory block group, including the selected memory block, in response to the block select signal and a coupling control signal.

* * * * *